(12) United States Patent
Sanchez et al.

(10) Patent No.: US 8,558,591 B1
(45) Date of Patent: Oct. 15, 2013

(54) PHASE LOCKED LOOP WITH POWER SUPPLY CONTROL

(71) Applicants: Hector Sanchez, Cedar Park, TX (US);
Xinghai Tang, Cedar Park, TX (US);
Gayathri A. Bhagavatheeswaran,
Austin, TX (US)

(72) Inventors: Hector Sanchez, Cedar Park, TX (US);
Xinghai Tang, Cedar Park, TX (US);
Gayathri A. Bhagavatheeswaran,
Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/629,643

(22) Filed: Sep. 28, 2012

(51) Int. Cl.
*H03L 7/06* (2006.01)

(52) U.S. Cl.
USPC .......................... 327/156; 327/147; 327/158

(58) Field of Classification Search
USPC .................................................. 327/147, 156
See application file for complete search history.

(56) References Cited

U.S. PATENT DOCUMENTS

| | | | |
|---|---|---|---|
| 5,471,429 A | 11/1995 | Lee et al. | |
| 5,721,504 A | 2/1998 | Sato | |
| 5,732,032 A | 3/1998 | Park et al. | |
| 6,667,663 B2 * | 12/2003 | Ozawa | 331/17 |
| 6,765,430 B2 | 7/2004 | Ando | |
| 6,885,234 B2 | 4/2005 | Ando | |
| 6,940,337 B2 | 9/2005 | Viswanathan et al. | |
| 7,123,236 B2 | 10/2006 | Ker et al. | |
| 7,498,886 B2 | 3/2009 | Lin | |
| 7,616,075 B2 * | 11/2009 | Kushiyama | 331/186 |
| 7,724,078 B2 | 5/2010 | Kurd et al. | |
| 7,880,550 B2 | 2/2011 | Mai et al. | |
| 8,305,155 B2 * | 11/2012 | Yamaguchi | 331/185 |
| 2002/0167367 A1 * | 11/2002 | Ingino, Jr. | 331/186 |
| 2005/0068076 A1 * | 3/2005 | Iroaga | 327/158 |
| 2009/0309633 A1 * | 12/2009 | Kotowski et al. | 327/108 |
| 2010/0253438 A1 * | 10/2010 | Yamaguchi | 331/34 |
| 2010/0271117 A1 | 10/2010 | Chou | |
| 2010/0315171 A1 | 12/2010 | Mai et al. | |
| 2011/0209021 A1 | 8/2011 | Sorensen et al. | |
| 2011/0298505 A1 * | 12/2011 | Khoury et al. | 327/156 |
| 2012/0194238 A1 * | 8/2012 | Maneatis et al. | 327/157 |

OTHER PUBLICATIONS

U.S. Appl. No. 13/627,333, filed Sep. 26, 2012.
U.S. Appl. No. 13/627,327, filed Sep. 26, 2012.

\* cited by examiner

*Primary Examiner* — Adam Houston
(74) *Attorney, Agent, or Firm* — James L. Clingan, Jr.; Joanna G. Chiu

(57) ABSTRACT

A phase locked loop (PLL) includes a phase frequency detector powered by a first analog supply voltage; a charge pump powered by a second analog supply voltage, different from the first analog supply voltage; a voltage controlled oscillator (VCO) powered by a third analog supply voltage, different from the first and second analog supply voltages, wherein a frequency of the VCO is controlled by a control voltage; and a supply voltage provider having a first circuit node coupled to a fourth analog supply voltage, a second circuit node which provides the first analog supply voltage, a third circuit node which provides the second analog supply voltage, and a fourth circuit node which provides the third analog supply voltage, and a current compensator coupled to one of the second, third, or fourth circuit nodes, wherein the current compensator provides a variable current draw based on the control voltage.

20 Claims, 2 Drawing Sheets

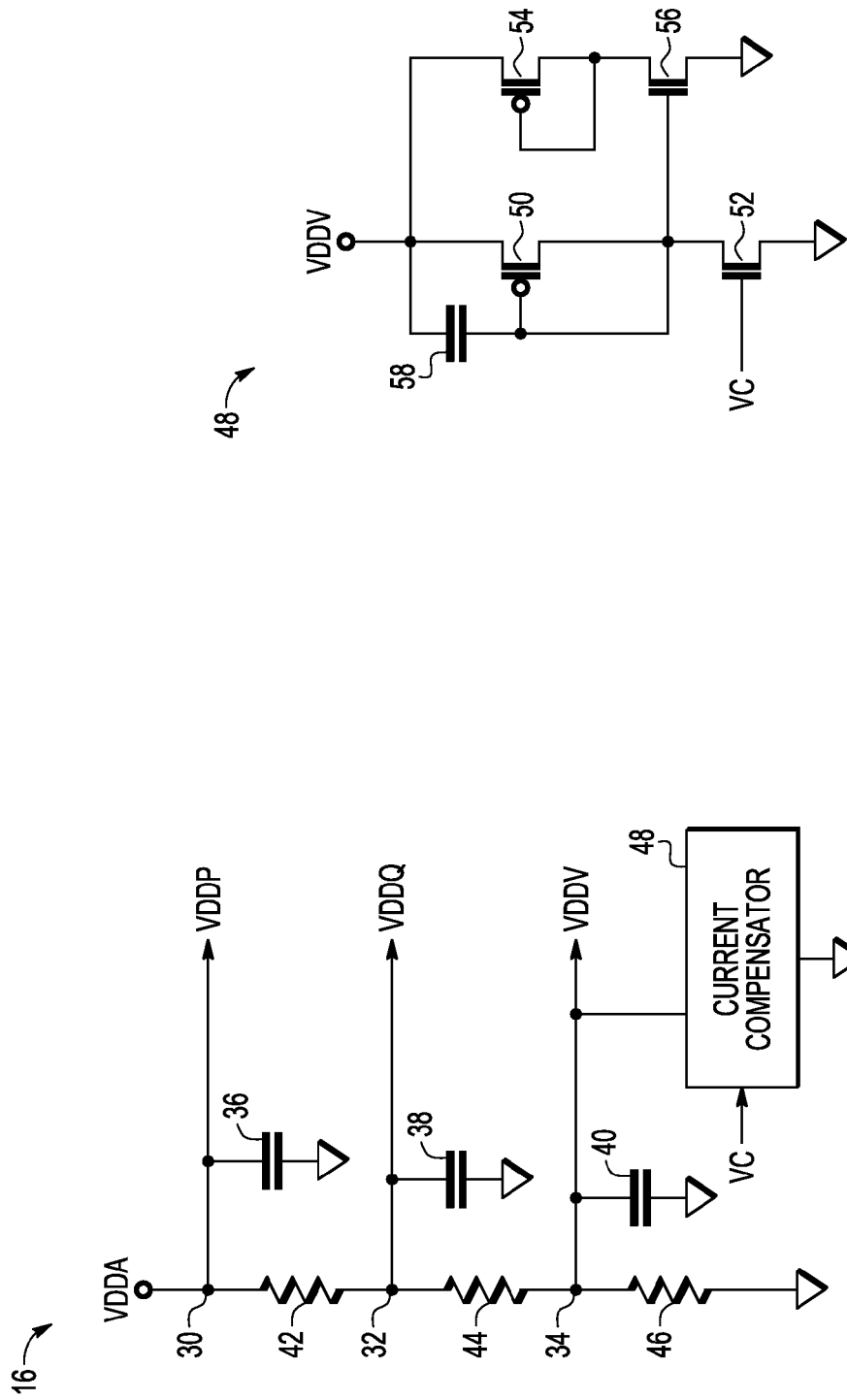

PHASE LOCKED LOOP WITH POWER SUPPLY CONTROL

BACKGROUND

1. Field

This disclosure relates generally to phase locked loops, and more specifically, to phase locked loops with power supply control.

2. Related Art

Phase locked loops (PLLs) are very important for controlling clock frequency which is a significant consideration for processors and other circuits operating at high frequencies. PLLs present an inherent difficulty in they are mostly analog in operation in an environment that has mostly logic circuits. Thus semiconductor manufacturing processes that may be optimized for logic circuits may not be optimum for analog applications. In the case of PLLs controlling the clock for a system that is mostly logic circuits, the manufacturing process being used is typically optimized for logic circuits. Thus, the PLL is likely to be made by a logic manufacturing process rather than an analog manufacturing process. This is further compounded by the continuing shrinking of critical dimensions and power supply voltage. The reduction in power supply voltage, which may be necessitated by the dimension shrinkage, does not generally benefit analog operation.

Accordingly, there is a need for addressing the concerns addressed above in the context of a PLL and a digital circuit on the same integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 is a combination circuit and block diagram of a supply voltage portion of the PLL of FIG. 1; and FIG. 3 is a circuit diagram of the block diagram portion of FIG. 2.

DETAILED DESCRIPTION

Figure 1:
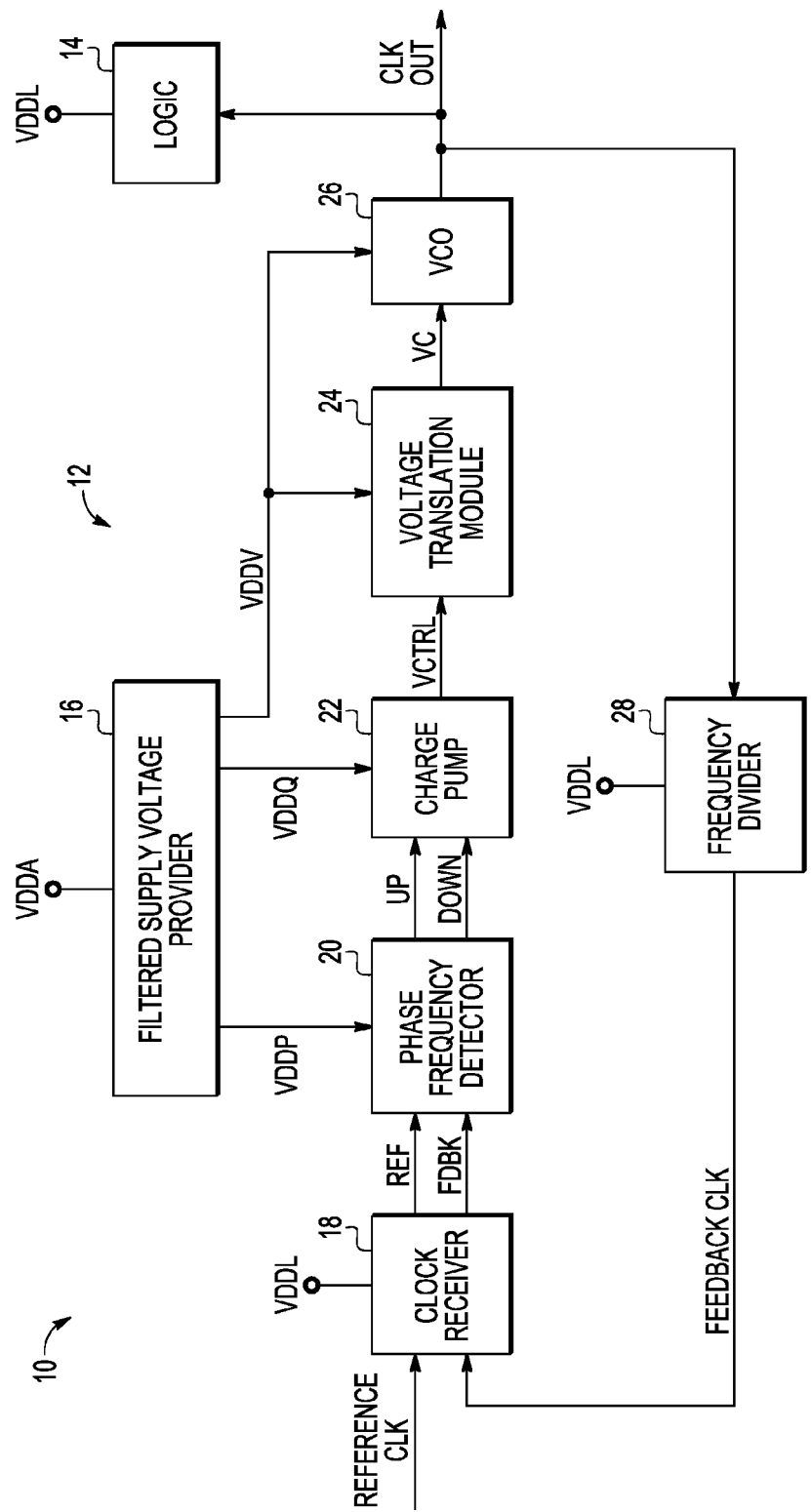
FIG. 1 is a block diagram of a system that includes a phased lock loop (PLL) on the same integrated circuit that includes logic circuits.

In one aspect, a phase locked loop includes a filtered supply voltage provider that utilizes an external voltage greater than an external voltage for logic circuits to provide separate supply voltages for the phase frequency detector, charge pump, and voltage controlled oscillator (VCO). These three elements are designed so as to be able to provide high quality functionality at the received power supply voltage. These separate supply voltages need not be provided with extreme precision so that the filtered supply voltage provider can be relatively simple.

Shown in FIG. 1 is a system 10 comprising a phase locked loop (PLL) 12 and logic 14. PLL 12 comprises a filtered supply voltage provider 16, a clock receiver 18 for a receiving a reference clock shown as reference CLK and outputs a reference signal shown as REF and a feedback signal shown as FDBK, a phase frequency detector 20 that receives REF and FDBK and outputs an up signal and a down signal, a charge pump 22 that receives the up and down signals and outputs a voltage that is responsive to the up and down signals and shown as VCTRL, a voltage translation module 24 that receives VCTRL and provides a voltage control signal shown as VC, a voltage controlled oscillator (VCO) 26 that receives VC and provides a clock output shown as CLK OUT, and a frequency divider 28 that provides a feedback clock output shown as FEEDBACK CLK coupled to an input of clock receiver 18. Logic 1, which also receives CLK OUT, receives a power supply voltage VDDL that may be an externally provided voltage such as 1.0 volt for providing power to logic 14. System 10 may be a single integrated circuit in which logic 14 is the vast majority of the circuitry of system 10. Filtered supply voltage provider 16 receives an analog power supply voltage that may be provided externally from the integrated circuit of system 10 and may be 1.8 volt. Filtered supply voltage provider 16 provides a power supply voltage VDDP as the power supply voltage to phase frequency detector 20, a power supply voltage VDDQ as the power supply voltage for charge pump 22, and a power supply voltage VDDV as the power supply voltage for voltage translation module 24, a power supply voltage and for VCO 26. Frequency divider 28 and clock receiver 18 receive power supply voltage VDDL as their power supply voltage.

In normal PLL form, clock receiver 18 receives a reference clock and a feedback clock and provides REF and FDBK to phase frequency detector 20 that responds by asserting either the up signal or the down signal to charge pump 22 or both up and down signals with different durations depending upon the phase frequency detector architecture. Charge pump either increases or decreases its output VCTRL in response to the up signal being asserted or the down signal being asserted respectively. Voltage translation module 24 then performs a translation of VCTRL to provide voltage control signal VC to VCO which responds by providing CLK OUT at the frequency indicated by voltage signal VC. CLK OUT is then used by logic 14 in logic operations. Frequency divider 28 divides CLK OUT and provides the feedback clk to clock receiver 18.

VCO 26 must operate at very high frequency, and thus it is desirable to use the highest speed devices available which have relatively low threshold voltages. Thus the transistors used for VCO 26 are desirably the highest speed transistors available which are the transistors that have thin gate dielectrics and have low breakdown voltages and thus operate at the low power supply voltage. It is desirable though to isolate the power supply for the VCO from the logic due to the noise generated on the logic power supply VDDL. Thus, VDDV is at or near the same voltage as VDDL but is provided separately from VDDL. Charge pump 22 is preferably operated with low leakage transistors which have a thicker gate dielectric than for logic transistors. With the thicker the gate dielectric there is also a higher threshold voltage. The higher threshold voltage of these transistors requires a higher power supply voltage for normal operation of a charge pump. Thus VDDQ is selected to be greater than VDDL and VDDV. Phase frequency detector power supply voltage VDDP is provided at a at an even higher voltage VDDQ because it can tolerate that higher voltage and because it is then convenient to provide noise separation between VDDQ and VDDP. Phase frequency detector 20 generates current spikes that, if on the same power supply for charge pump 22, would cause unwanted jitter on CLK OUT. The transistors for phase frequency detector 20 may be of the same type, ones with relatively thicker gate dielectrics, as the transistors for charge pump 22.

Shown in FIG. 2 is filtered supply voltage provider 16 having a node 30 coupled to external analog power supply VDDA, a capacitor 36, a capacitor 38, a capacitor 40, a resistor 42, a resistor 44, a resistor 46, and a current compensator 48. Capacitor 36 has a first electrode connected to node 30 and a second electrode connected to ground. Supply voltage VDDP is provided at node 30 and filtered by capacitor 36. Resistor 44 has a first electrode coupled to node 30 and a second electrode connected to node 32. Capacitor 38 has a first electrode connected to node 32 and a second electrode connected to ground. Voltage VDDQ is provided at node 32. Resistor 44 has a first electrode connected to node 32 and a second electrode connected to node 34. Capacitor 40 has a first electrode connected to node 34 and a second electrode connected to ground. Supply voltage VDDV is provided at node 34. Resistor 46 has a first electrode connected to node 34 and a second electrode connected to ground. Current compensator 48 has a first input for receiving signal VC, a second input connected to node 34, and a power supply terminal connected to ground. Resistors 42, 44, and 46 may each be made up of resistors in series. Forming a single resistance from multiple resistors in series may be beneficial for achieving a desired precision, heat dissipation, and sometimes for tuning resistance. The level of voltage VDDQ arises from voltage division through resistors in series. For example voltage VDDQ is a function of the resistance of resistor 42 divided by the sum of the resistances of resistors 42, 44, and 46 times the voltage of VDDA.

Each supply voltage has a load so that some current, that may be called load current, is diverted so some of the current that passes through resistor 42 may not pass through resistors 44 and 46 also. The load current can affect the voltage at node 32, which is supply voltage VDDQ, and node 34 which is supply voltage VDDV. The variation in voltage VDDQ arising from changes in the current drawn by charge pump 22 can be well tolerated and have minimal effect on the performance of charge pump 22. On the other hand, changes in VDDV arising in current drawn by VCO 26 can provide some adverse impact on the performance of VCO 26. Current compensator 48 provides a current flow between node 34 and ground that is increased when there is a decrease in current drawn by VCO 26 and decreased when there is an increase in current drawn by VCO 26. Signal VC is an indicator of current drawn by VCO 26. An increase in VC indicates an increase in frequency and thus an increase in current drawn by VCO 26. The combination of resistance and capacitance at nodes 32 and 34 is to achieve a desired noise cutoff frequency.

Shown in FIG. 3 is current compensator 48 comprising a transistor 50, a transistor 52, transistor 54, a transistor 56, and a capacitor 58. Transistors 50 and 54 are P channel, and transistors 52 and 56 are N channel. Transistor 50 has a source connected to VDDV, which is node 34, a gate, and a drain connected to the gate. Transistor 52 has drain connected to the gate and drain of transistor 50, a gate for receiving voltage control VC, and a source connected to ground. Transistor 54 has a source connected to VDDV, a gate, and a drain connected the gate. Transistor 56 has a drain connected to the gate and drain of transistor 54, a gate connected to the drains of transistors 50 and 52, and a source connected to ground. Capacitor 58 has a first electrode connected to VDDV and a second electrode connected to the gate of transistor 50. Transistors 50 and 52 are relatively small and draw minimal current relative to transistors 54 and 56 which are relatively bigger. When voltage control VC increases, the voltage at the drain of transistor 52 decreases causing transistor 56 to become less conductive which in turn decreases the current flow through transistors 54 and 56. When voltage control VC decreases, which will cause VCO 26 to draw less current, the drain of transistor 52 increases in voltage which causes an increase in current through transistors 54 and 56 to offset the current decrease through VCO 26. Transistors 54 and 56 are sized to match the dynamic current flow through VCO 26 responsive to voltage control VC. Thus, the effect of the variable current drawn by VCO 26 is significantly reduced.

With the choice of supply voltage levels, especially the relative levels and use of the logic supply level, and the choice of transistor construction for the phase frequency detector, the charge pump, and the VCO result in the ability to provide different voltages simply with requiring the complexity of typical voltage regulators. Most commonly, voltage regulators include a bandgap reference which results in substantial complexity and corresponding cost. PLL 12 on the other hand, with the choice of transistor construction and voltage levels allows for a much simpler filtered supply voltage provider that mostly uses a resistive divider. Current compensator used in supplying the supply voltage for the VCO is quite simple compared to regulators using a bandgap reference.

By now it should be appreciated that there has been provided a phase locked loop (PLL) that includes a phase frequency detector powered by a first analog supply voltage. The PLL further includes a charge pump coupled to the phase frequency detector, the charge pump powered by a second analog supply voltage, different from the first analog supply voltage. The PLL further includes a voltage controlled oscillator (VCO) coupled to the charge pump, the VCO powered by a third analog supply voltage, different from the first analog supply voltage and different from the second analog supply voltage, wherein a frequency of the VCO is controlled by a control voltage. The PLL further includes a supply voltage provider having a first circuit node coupled to a fourth analog supply voltage, a second circuit node which provides the first analog supply voltage, a third circuit node which provides the second analog supply voltage, and a fourth circuit node which provides the third analog supply voltage, and a current compensator coupled to one of the second, third, or fourth circuit nodes, wherein the current compensator provides a variable current draw from the one of the second, third, or fourth circuit nodes based on the control voltage. The PLL may have a further characterization by which the first circuit node and the second circuit node are a same circuit node. The PLL may further include a filtering circuit coupled to each of the second, third, and fourth circuit nodes, wherein each filtering circuit has a different noise cutoff frequency. The PLL may have a further characterization by which the supply voltage provider includes a first resistor having a first terminal coupled to the second circuit node and a second terminal coupled to the third circuit node, a second resistor having a first terminal coupled to the third circuit node and a second terminal coupled to the fourth circuit node, a third resistor having a first terminal coupled to the fourth circuit node and a second terminal coupled to ground, and a first capacitor having a first terminal coupled to the third circuit node and a second terminal coupled to ground. The PLL may have a further characterization by which the current compensator is coupled to the fourth circuit node and provides the variable current draw from the fourth circuit node based on the control voltage such that the fourth circuit node remains at a substantially constant predetermined voltage level. The PLL may have a further characterization by which the current compensator includes a first N-channel transistor having a control electrode coupled to receive the control voltage, a first current electrode, and a second current electrode coupled to ground, a second N-channel transistor having a control electrode coupled to the first current electrode of the first N-channel transistor, a first current electrode, and a second current electrode coupled to ground, a first P-channel transistor having a first current electrode coupled to the fourth circuit node which provides the third analog supply voltage, a control electrode coupled to the first current electrode of the second N-channel transistor, and a second current electrode coupled to the first current electrode of the second N-channel transistor, and a second P-channel transistor having a first current electrode coupled to the fourth circuit node which provides the third analog supply voltage, a control electrode coupled to the first current electrode of the first N-channel transistor, and a second current electrode coupled to the first current electrode of the first N-channel transistor. The PLL may have a further characterization by which a current through the second N-channel transistor is inversely proportional to a current consumed by the VCO. The PLL may further include a voltage translation module coupled to receive an input control voltage from the charge pump which has a maximum voltage value of the second analog supply voltage and to provide the control voltage to the VCO, wherein the control voltage is proportional to the input control voltage and has a maximum voltage value of the third analog supply voltage. The PLL may further include a clock receiver coupled to the phase frequency detector and powered by a logic supply voltage and a frequency divider coupled between the VCO and the clock receiver and powered by the logic supply voltage. The PLL may have a further characterization by which the fourth analog supply voltage is received at an input pad of the integrated circuit. The PLL may have a further characterization by which the supply voltage provider is devoid of a bandgap reference generator.

Disclosed also is a PLL that includes a phase frequency detector powered by a first analog supply voltage. The PLL further includes a charge pump coupled to the phase frequency detector, the charge pump powered by a second analog supply voltage, different from the first analog supply voltage. The PLL further includes a voltage controlled oscillator (VCO) coupled to the charge pump, the VCO powered by a third analog supply voltage, different from the first analog supply voltage and different from the second analog supply voltage, wherein a frequency of the VCO is controlled by a control voltage. The PLL further includes a supply voltage provider having a first circuit node coupled to a fourth analog supply voltage, the supply voltage provider. The supply voltage provider includes a first resistor having a first terminal coupled to the first circuit node and a second terminal coupled to a second circuit node, a second resistor having a first terminal coupled to the second circuit node and a second terminal coupled to a third circuit node, a third resistor having a first terminal coupled to the third circuit node and a second terminal coupled to ground, and a first capacitor having a first terminal coupled to the third circuit node and a second terminal coupled to ground, wherein the first circuit node provides the first analog supply voltage, the second circuit node provides the second analog supply voltage, and the third circuit node provides the third analog supply voltage. The PLL may further include a second capacitor having a first terminal coupled to the second circuit node and a second terminal coupled to ground. The PLL may further include a third capacitor having a first terminal coupled to the first circuit node and a second terminal coupled to ground. The PLL may further include a current compensator coupled to the third circuit node, wherein the current compensator provides a variable current draw from the third circuit node based on the control voltage. The PLL may further include a voltage translation module coupled to receive an input control voltage from the charge pump which has a maximum voltage value of the second analog supply voltage and to provide the control voltage to the VCO, wherein the control voltage is proportional to the input control voltage and has a maximum voltage value of the third analog supply voltage.

Also disclosed is a method in a PLL including providing a first analog supply voltage from a first circuit node of a plurality of series-connected resistors to a phase frequency detector of the PLL. The method further includes providing a second analog supply voltage from a second circuit node of the plurality of series-connected resistors to a charge pump of the PLL. The method further includes providing a third analog supply voltage from a third circuit node of the plurality of series-connected resistors to a VCO of the PLL, wherein each of the first, second, and third analog supply voltages are different. The method further includes providing an input control voltage to the VCO to control a frequency of the VCO, wherein the input control voltage is provided based on an output control voltage of the charge pump. The method further includes drawing a variable current from the third circuit node in response to the input control voltage such that the third analog supply voltage remains at a substantially constant predetermined voltage level. The method may further include filtering noise at the first circuit node using a first noise cutoff frequency, filtering noise at the second circuit node using a second noise cutoff frequency, and filtering noise at the third circuit node using a third noise cutoff frequency, wherein the first, second, and noise cutoff frequencies are different from each other. The method may further include receiving an external analog supply voltage at the first circuit node of the plurality of series-connected resistors. The method may have a further characterization by which the drawing a variable current from the third circuit node in response to the input control voltage is characterized in that the variable current is inversely proportional to a current consumed by the VCO.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, the power supply voltages may be different than those chosen. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A phase locked loop (PLL) comprising:
   a phase frequency detector powered by a first analog supply voltage;
   a charge pump coupled to the phase frequency detector, the charge pump powered by a second analog supply voltage, different from the first analog supply voltage;
   a voltage controlled oscillator (VCO) coupled to the charge pump, the VCO powered by a third analog supply voltage, different from the first analog supply voltage and different from the second analog supply voltage, wherein a frequency of the VCO is controlled by a control voltage; and
   a supply voltage provider having a first circuit node coupled to a fourth analog supply voltage, a second circuit node which provides the first analog supply voltage, a third circuit node which provides the second analog supply voltage, and a fourth circuit node which provides the third analog supply voltage, and a current compensator coupled to one of the second, third, or fourth circuit nodes, wherein the current compensator provides a variable current draw from the one of the second, third, or fourth circuit nodes based on the control voltage.

2. The PLL of claim 1 wherein the first circuit node and the second circuit node are a same circuit node.

3. The PLL of claim 1, further comprising:
   a filtering circuit coupled to each of the second, third, and fourth circuit nodes, wherein each filtering circuit has a different noise cutoff frequency.

4. The PLL of claim 1, wherein the supply voltage provider comprises:
   a first resistor having a first terminal coupled to the second circuit node and a second terminal coupled to the third circuit node;
   a second resistor having a first terminal coupled to the third circuit node and a second terminal coupled to the fourth circuit node;
   a third resistor having a first terminal coupled to the fourth circuit node and a second terminal coupled to ground; and
   a first capacitor having a first terminal coupled to the third circuit node and a second terminal coupled to ground.

5. The PLL of claim 1, wherein the current compensator is coupled to the fourth circuit node and provides the variable current draw from the fourth circuit node based on the control voltage such that the fourth circuit node remains at a substantially constant predetermined voltage level.

6. The PLL of claim 5, wherein the current compensator comprises:
   a first N-channel transistor having a control electrode coupled to receive the control voltage, a first current electrode, and a second current electrode coupled to ground;
   a second N-channel transistor having a control electrode coupled to the first current electrode of the first N-channel transistor, a first current electrode, and a second current electrode coupled to ground;
   a first P-channel transistor having a first current electrode coupled to the fourth circuit node which provides the third analog supply voltage, a control electrode coupled to the first current electrode of the second N-channel transistor, and a second current electrode coupled to the first current electrode of the second N-channel transistor; and
   a second P-channel transistor having a first current electrode coupled to the fourth circuit node which provides the third analog supply voltage, a control electrode coupled to the first current electrode of the first N-channel transistor, and a second current electrode coupled to the first current electrode of the first N-channel transistor.

7. The PLL of claim 6, wherein a current through the second N-channel transistor is inversely proportional to a current consumed by the VCO.

8. The PLL of claim 1, further comprising:
   a voltage translation module coupled to receive an input control voltage from the charge pump which has a maximum voltage value of the second analog supply voltage and to provide the control voltage to the VCO, wherein the control voltage is proportional to the input control voltage and has a maximum voltage value of the third analog supply voltage.

9. The PLL of claim 8, further comprising:
   a clock receiver coupled to the phase frequency detector and powered by a logic supply voltage; and
   a frequency divider coupled between the VCO and the clock receiver and powered by the logic supply voltage.

10. An integrated circuit comprising the PLL of claim 1, wherein the fourth analog supply voltage is received at an input pad of the integrated circuit.

11. The PLL of claim 1, wherein the supply voltage provider is devoid of a bandgap reference generator.

12. A phase locked loop (PLL) comprising:
   a phase frequency detector powered by a first analog supply voltage;
   a charge pump coupled to the phase frequency detector, the charge pump powered by a second analog supply voltage, different from the first analog supply voltage;
   a voltage controlled oscillator (VCO) coupled to the charge pump, the VCO powered by a third analog supply voltage, different from the first analog supply voltage and different from the second analog supply voltage, wherein a frequency of the VCO is controlled by a control voltage; and
   a supply voltage provider having a first circuit node coupled to a fourth analog supply voltage, the supply voltage provider comprising:
      a first resistor having a first terminal coupled to the first circuit node and a second terminal coupled to a second circuit node;
      a second resistor having a first terminal coupled to the second circuit node and a second terminal coupled to a third circuit node;
      a third resistor having a first terminal coupled to the third circuit node and a second terminal coupled to ground; and
      a first capacitor having a first terminal coupled to the third circuit node and a second terminal coupled to ground, wherein the first circuit node provides the first analog supply voltage, the second circuit node provides the second analog supply voltage, and the third circuit node provides the third analog supply voltage.

13. The PLL of claim 12, further comprising:
   a second capacitor having a first terminal coupled to the second circuit node and a second terminal coupled to ground.

14. The PLL of claim 13, further comprising:
   a third capacitor having a first terminal coupled to the first circuit node and a second terminal coupled to ground.

15. The PLL of claim 12, further comprising:

a current compensator coupled to the third circuit node, wherein the current compensator provides a variable current draw from the third circuit node based on the control voltage.

16. The PLL of claim 12, further comprising:

a voltage translation module coupled to receive an input control voltage from the charge pump which has a maximum voltage value of the second analog supply voltage and to provide the control voltage to the VCO, wherein the control voltage is proportional to the input control voltage and has a maximum voltage value of the third analog supply voltage.

17. In a phase locked loop (PLL), a method comprising:

providing a first analog supply voltage from a first circuit node of a plurality of series-connected resistors to a phase frequency detector of the PLL;

providing a second analog supply voltage from a second circuit node of the plurality of series-connected resistors to a charge pump of the PLL;

providing a third analog supply voltage from a third circuit node of the plurality of series-connected resistors to a VCO of the PLL, wherein each of the first, second, and third analog supply voltages are different;

providing an input control voltage to the VCO to control a frequency of the VCO, wherein the input control voltage is provided based on an output control voltage of the charge pump; and drawing a variable current from the third circuit node in response to the input control voltage such that the third analog supply voltage remains at a substantially constant predetermined voltage level.

18. The method of claim 17, further comprising:

filtering noise at the first circuit node using a first noise cutoff frequency;

filtering noise at the second circuit node using a second noise cutoff frequency; and filtering noise at the third circuit node using a third noise cutoff frequency, wherein the first, second, and noise cutoff frequencies are different from each other.

19. The method of claim 17, further comprising:

receiving an external analog supply voltage at the first circuit node of the plurality of series-connected resistors.

20. The method of claim 17, wherein the drawing a variable current from the third circuit node in response to the input control voltage is characterized in that the variable current is inversely proportional to a current consumed by the VCO.

\* \* \* \* \*